(12) United States Patent
Schneider et al.

(10) Patent No.: US 9,228,697 B2
(45) Date of Patent: Jan. 5, 2016

(54) 3D-CAMERA AND METHOD FOR THE THREE-DIMENSIONAL MONITORING OF A MONITORING AREA

(75) Inventors: Florian Schneider, Reute (DE); Stephan Schmitz, Freiburg (DE)

(73) Assignee: SICK AG, Waldkirch (DE)

( * ) Notice: Subject to any disclaimer, the term of this patent is extended or adjusted under 35 U.S.C. 154(b) by 631 days.

(21) Appl. No.: 13/463,352

(22) Filed: May 3, 2012

(65) Prior Publication Data

US 2012/0293625 A1 Nov. 22, 2012

(30) Foreign Application Priority Data

May 18, 2011 (EP) .................................... 11166555

(51) Int. Cl.
| | |
|---|---|
| *H01S 3/14* | (2006.01) |
| *G01B 11/14* | (2006.01) |
| *H04N 13/02* | (2006.01) |
| *F16P 3/14* | (2006.01) |
| *G06T 7/00* | (2006.01) |
| *H01S 5/42* | (2006.01) |
| *H01S 5/00* | (2006.01) |
| *H01S 5/183* | (2006.01) |

(52) U.S. Cl.
CPC .............. *F16P 3/142* (2013.01); *G06T 7/0075* (2013.01); *H01S 5/423* (2013.01); *H04N 13/0253* (2013.01); *G06T 2207/10012* (2013.01); *H01S 5/005* (2013.01); *H01S 5/18394* (2013.01)

(58) Field of Classification Search
CPC .............................. F16P 3/142; H04N 13/0253
See application file for complete search history.

(56) References Cited

U.S. PATENT DOCUMENTS

| | | | | |
|---|---|---|---|---|
| 7,777,173 | B2* | 8/2010 | Price et al. | 250/221 |
| 8,615,028 | B1* | 12/2013 | Sayyah et al. | 372/50.123 |
| 2004/0101008 | A1* | 5/2004 | Kurtz et al. | 372/39 |
| 2004/0184031 | A1 | 9/2004 | Vook et al. | |
| 2004/0247236 | A1 | 12/2004 | Yoshimura et al. | |
| 2007/0025612 | A1 | 2/2007 | Iwasaki et al. | |
| 2007/0263903 | A1 | 11/2007 | St. Hilaire et al. | |
| 2008/0240502 | A1 | 10/2008 | Freedman et al. | |
| 2009/0225329 | A1 | 9/2009 | Bendall et al. | |
| 2009/0251685 | A1* | 10/2009 | Bell | 356/51 |
| 2010/0008588 | A1 | 1/2010 | Feldkhun et al. | |
| 2010/0060885 | A1* | 3/2010 | Nobis et al. | 356/139.09 |
| 2010/0073461 | A1* | 3/2010 | Hammes et al. | 348/42 |
| 2010/0118123 | A1 | 5/2010 | Freedman et al. | |
| 2011/0295331 | A1* | 12/2011 | Wells et al. | 607/3 |
| 2012/0229032 | A1* | 9/2012 | Van De Ven et al. | 315/151 |

FOREIGN PATENT DOCUMENTS

| | | |
|---|---|---|
| CN | 1809867 A | 7/2006 |
| DE | 102010017857 A1 | 10/2011 |
| EP | 2019281 A1 | 1/2009 |
| EP | 2166304 A1 | 3/2010 |
| WO | 2006085834 A1 | 8/2006 |
| WO | 2006109308 A1 | 10/2006 |
| WO | 2009093228 A2 | 7/2009 |

\* cited by examiner

*Primary Examiner* — Hee-Yong Kim
(74) *Attorney, Agent, or Firm* — Nath, Goldberg & Meyer; Jerald L. Meyer; Leonid D. Thenor

(57) ABSTRACT

A 3D-camera (10) is provided, having at least one image sensor (14*a-b*) and at least one illumination unit (100) which comprises a light source and which is configured for generating an irregular illumination pattern (20) in an illumination area (12) of the 3D-camera (10). The light source comprises a semiconductor array (104) having a plurality of individual emitter elements (106) in an irregular arrangement, and a respective individual emitter element (106) generates a pattern element (112) of the irregular illumination pattern (20).

15 Claims, 3 Drawing Sheets

3D-CAMERA AND METHOD FOR THE THREE-DIMENSIONAL MONITORING OF A MONITORING AREA

Figure 1:
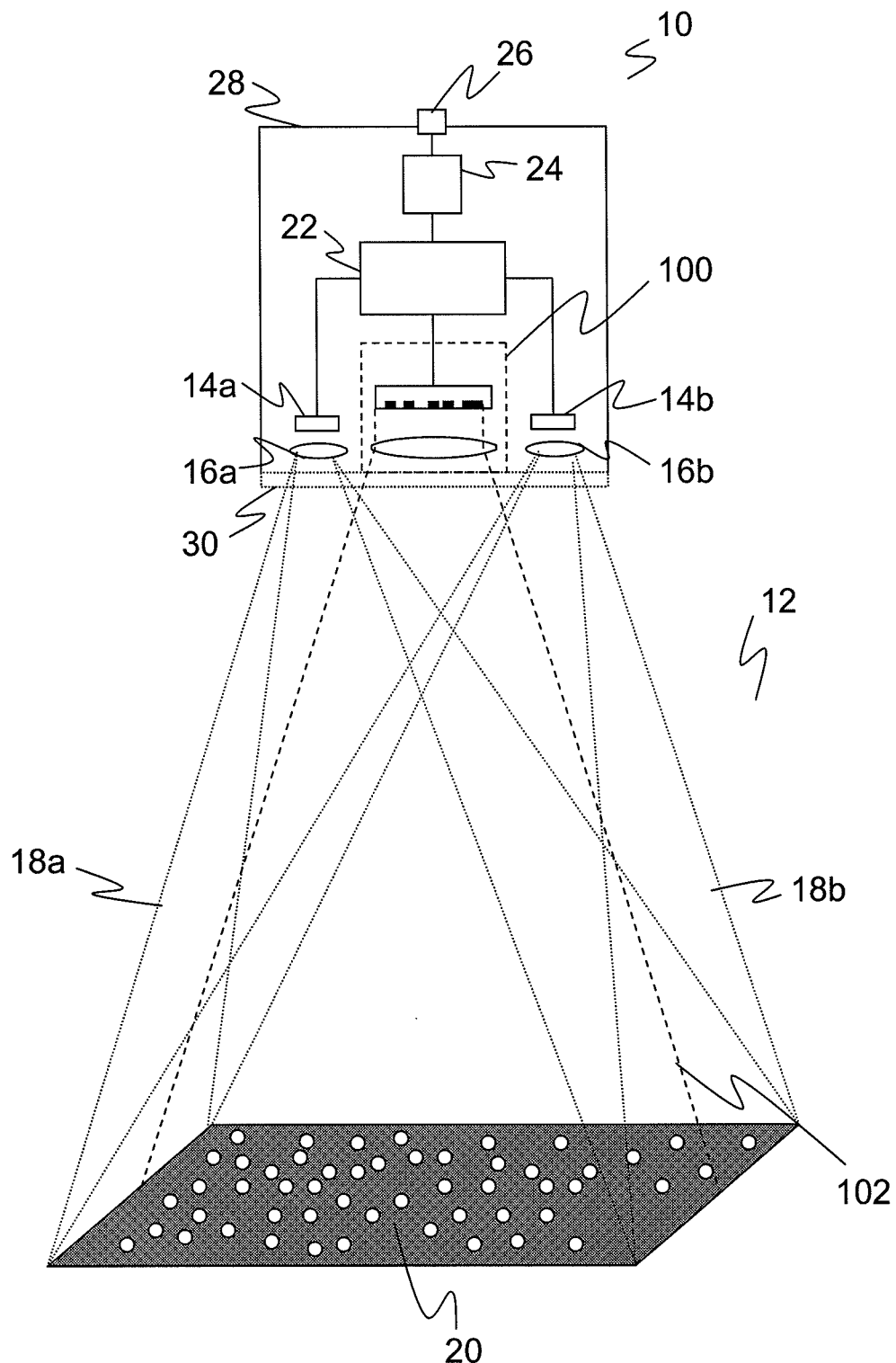

The invention relates to a 3D camera having an illumination unit and to a method for the three-dimensional monitoring of a monitoring area according to the preamble of claim 1 and 18, respectively.

Unlike conventional cameras, a 3D-camera also captures depth information and thus generates three-dimensional image data which are also referred to as distance image or depth map. The additional distance dimension can be used in a plurality of applications to gain more information about objects in the scenery monitored by the camera.

On example is safety technology. A typical safety application is securing a dangerous machine such as a press or a robot, where upon intrusion of a body part in a danger zone around the machine a safety measure is triggered. This depends on the situation and can be shutdown of the machine or movement into a safe position. With the additional depth information, three-dimensional protection zones can be defined that can be better adapted to the danger situation than two-dimensional protection zones, and it can also better be judged whether a person approaches the danger source in a critical way.

In another application, detected movements are interpreted as a command to a control connected to the 3D-camera. To that end, gestures are detected as an example. Although this is mainly known from consumer electronics, it can also be used to operate or configure a sensor in safety technology, like for example described in DE 10 2010 017 857.

A known principle for detecting three-dimensional image data is based on triangulation with the aid of an active pattern illumination. For stereoscopic system, at least two images are generated from different perspectives. In overlapping image areas, identical structures are identified, and from the disparity and the optical parameters of the camera system distances and thus the three-dimensional image or the depth map, respectively, are calculated by triangulation.

In principle, a stereo camera can also work passively, i.e. without its own pattern illumination. For a reliable image evaluation, especially in safety technology, it is required to generate three-dimensional image data as a dense depth map, i.e. to have a reliable distance value for each image area to be evaluated and preferably for nearly each image pixel. If the scenery to be monitored is weak in contrast or has regions with little structure, this cannot be achieved by a passive sensor. Large featureless areas or mutually similar features can prevent an unambiguous association of image regions when locating the correspondences between the features of the images. This results in gaps in the three-dimensional images or incorrect calculations of the distances.

Other triangulation systems only use one camera and evaluate changes of the projected pattern by objects in different distances. The illumination pattern is taught to the system so that an expectation for the image data at different object distances and structures is generated. One possibility is to teach the illumination pattern on objects, in particular a surface, in different distances as a reference image. In such systems, an active illumination is essential from the outset.

EP 2 166 304 A1 discloses an illumination unit for a stereoscopic safety camera. An irregular illumination pattern is generated by an optical phase element that is trans-miffed by a divergent laser light source. With such a phase element, the required intensities of the illumination pattern in a desired range cannot be achieved.

In US 2007/0263903 A1, a stereoscopic camera system generates a structured illumination pattern by means of an illumination unit, and the pattern is used to calculate distances. The pattern is generated by illuminating a diffractive optical element with a laser or an LED. A problem with using a diffractive optical element is that a relatively large light portion is transmitted in zeroth diffraction order. Then, for reasons of eye safety, this illumination unit cannot be operated at the required light intensities.

For that reason, in WO 2009/093228 A2, a second diffractive element is arranged downstream in a similar arrangement. The light beam of zeroth diffraction order is thus distributed another time.

Using illumination units based on diffractive optical elements has the additional disadvantage that the single mode laser diodes with very small emitter surface required as light sources for such systems are available with only relatively small output power significantly below one Watt, and have only limited durability. This has a negative effect on visual field or angle of view, range, exposure time, and the detection capability or availability, respectively. Such illumination units are only of limited use for illuminating larger areas at larger distances as are required for applications in safety technology.

In another known approach, for example described in US 2008/0240502 A1, a slide generates a dot pattern for a 3D sensor. According to US 2010/0118123 A1, the slide comprises a plurality of micro lenses in irregular arrangement.

Using a projection method with a slide or a slide with microlenses has only a limited efficiency energetically and thus economically. With use of a conventional slide, the dark areas of the illumination pattern are blocked instead of energy efficiently redistributed, so that the blocked light only contributes to heating the slide rather than illuminating the monitoring area. The lower the filling degree of the pattern is, i.e. the ratio of transmission area to total area of the slide, the lower is the efficiency. This is particularly disadvantageous because a filling degree of for example 10-20% already suffices for generating dense depth maps. Therefore, 80-90% of the output power are not used. This is not only energetically inefficient, but also increases the manufacturing costs, because the costs for laser diodes approximately scale linearly with the optical output power.

The use of slides with microlenses increases the efficiency as compared to a conventional slide due to the redistribution of the light. Because of the desired structure of the illumination pattern and, hence, the distribution of the microlenses, unused partial regions remain, and a high efficiency can therefore be achieved only to a certain extend.

It is therefore an object of the invention to improve the generation of an illumination pattern for a 3D-camera.

This object is satisfied by a 3D-camera having at least one image sensor and at least one illumination unit which comprises a light source and which is configured for generating an irregular illumination pattern in an illumination area of the 3D-camera, wherein the light source comprises a semiconductor array having a plurality of individual emitter elements in an irregular arrangement, and wherein a respective individual emitter element generates a pattern element of the irregular illumination pattern.

The object is also satisfied by a method for the three-dimensional monitoring of a monitoring area, wherein an illumination unit generates an irregular illumination pattern in the monitoring area, wherein a 3D-camera captures images of the illuminated monitoring area, wherein a plurality of individual light beams is transmitted by a corresponding plurality of individual emitter elements on a semiconductor array, wherein the individual emitter elements are arranged irregularly on the semiconductor array and the bundle of individual light beams leads to the irregular illumination pattern due to the irregular arrangement, wherein a respective individual emitter element generates a point-like pattern element of the illumination pattern via its individual light beam.

The invention starts from the basic idea to generate the desired pattern directly by the light source. This eliminates the need for a downstream pattern element and enables an optimal light output. Instead of a single homogenous light source, a semiconductor array with a plurality of individual emitter elements is used which are arranged irregularly. A respective individual emitter element generates an individual light beam which in turn forms a pattern element upon impinging on an object in the scenery.

Therefore, the irregular structure of the illumination pattern is directly achieved by the irregular arrangement of the individual emitter elements. An irregular arrangement is to be understood as an arrangement that causes no pseudo correlations or at least as few pseudo correlations as possible in the image evaluation. Ideally, the arrangement and thus the illumination pattern is free of symmetries, i.e. cannot be mapped onto itself by simple symmetry operations like translations or rotations. For stereo cameras, mainly translations parallel to the horizon are relevant.

The invention has the advantage that illumination patterns of particular high optical output power can be generated with high efficiency. The illumination pattern suitable for the respective application is adaptable by the structure of the semiconductor array and the arrangement of the individual emitter elements. The field of application for 3D-cameras, in particular camera based triangulation sensors, is thus extended. Visual field, angle of view, range, detection capability, and availability are increased and the exposure time is decreased.

The semiconductor array preferably is a VCSEL (Vertical-Cavity Surface-Emitting Laser) array. Throughout this description, preferably refers to a feature that is advantageous, but completely optional. By means of an irregular mask for the emitter surfaces, the desired arrangement of the individual emitter elements of the VCSEL array is achieved. Since due to the arrangement according to the invention very little of the initial output power is lost, VCSEL arrays with moderate total power of several Watt suffice. VCSEL arrays with higher powers can of course also be used, especially for very large ranges.

The semiconductor array preferably comprises a large number of at least a thousand, ten thousand, or a hundred thousand individual emitter elements. Such semiconductor arrays are available for example as VCSEL arrays at comparatively low costs. The large number of individual emitter elements with a corresponding large number of pattern elements in the illumination pattern leads to an illumination pattern with a sufficiently fine structure to guarantee a high resolution of the 3D-camera.

Each individual emitter element preferably comprises a point-like emitter surface, wherein the pattern element generated by the individual emitter element comprises the shape of the emitter surface. This results in a dot pattern, where each pattern element is a dot generated by an individual emitter element. The dot is of course not to be understood as a point having no dimensions in the strict geometrical. The dot intentionally has a certain finite extent so that is can be detected by the image sensor. The dot also has a geometric shape, e.g. has the shape of a circle, an ellipse, a rectangle, or is in more general terms limited by a polygon.

The point-like emitter surfaces preferably have at least one of mutually different shapes and sizes. The mutual distances of the emitter surfaces are already different due to the irregular arrangement. If also the shapes and/or the sizes are varied, the illumination pattern becomes even more irregular. This also depends on the evaluation algorithm. A certain minimal size of the pattern elements is required. On the other hand, too large a pattern element merely increases the filling degree and ultimately the energy consumption without improving the detection capabilities. It is also possible as an alternative for a simplified manufacturing that all point-like emitter surfaces have the same size and geometry. The irregularity of the illumination pattern then is based on the different distances only. This also provides sufficient degrees of freedom to avoid pseudo correlations.

The individual emitter elements preferably form at least two groups, wherein a group of individual emitter elements can be activated without activating the remaining groups of individual emitter elements. Then, it can be switched between different patterns that are generated by a respective group or a combination of several groups. In one embodiment, each individual emitter element forms its own group and, hence, can be selectively activated. If the semiconductor array is made with a higher density of individual emitter elements than required for the illumination, activation of subsets already generates a sufficient illumination. By selection of subsets or combinations of groups, an adaption of the illumination pattern to the given scenario is possible.

The individual emitter elements are preferably controllable with mutually different currents. This can for example be achieved by different resistance or thickness, respectively, of the leads. The individual pattern elements have a different brightness due to the introduced power gradient. This can also be exploited for adaption to a scenery. One case of particular interest is compensation of an intensity drop at the outer borders of the image. This is an adverse effect of optics and image sensors, respectively, which leads to inhomogenously illuminated images with darker borders. This is preferably compensated by controlling the individual emitter elements in an outer region of the semiconductor array with higher currents than individual emitter elements in an inner region of the semiconductor array.

The density of the individual emitter elements on the semiconductor array preferably varies. This is an alternative or additional possibility to generate brighter and darker regions in the illumination pattern. This can in particular also be used to compensate the intensity drop at the outer borders of the image. Then, preferably more individual emitter elements are provided in an outer region of the semiconductor array than in an inner region of the semiconductor array.

The arrangement of the pattern elements in the illumination pattern preferably corresponds to the arrangement of the individual emitter elements on the semiconductor array. The structure of the illumination pattern is thus directly determined by the arrangement of the individual emitter elements on the semiconductor array. There are no downstream pattern elements as described in the introduction which generate or modify the illumination pattern.

The illumination unit preferably comprises an imaging objective to image the illumination pattern from the near field at the semiconductor array into the monitoring area. A single lens may be sufficient for the imaging objective in the simplest case. The imaging objective can also be made reflective rather than refractive.

Because of the imaging objective, the individual emitter elements need not generate the pattern element in the far field of the monitoring area, but the pattern is already taken shortly behind the pattern generating element and projected into the monitoring area. The imaging objective compensates the divergence of the individual emitter elements that increases with smaller emitter surface. As an alternative to the projection it is also conceivable that the individual pattern elements are generated directly in the monitoring area by the pattern generating element, without downstream optical elements. However, this requires the divergence of the individual emitter elements to be so small that also without an imaging objective an irregular and no mixed, homogenous illumination is generated.

Imaging objective and semiconductor array are preferably arranged mutually movable to image different subsets of individual emitter elements. A respective different region of the semiconductor array is used for generating the illumination pattern to enable an adaption to the scenery.

In an embodiment, a microlens array is preferably arranged in front of the semiconductor array. The individual microlenses focus a respective individual light beam of the individual light emitters. Divergences of the semiconductor array can thus be compensated for, or especially small, sharply defined pattern elements can be generated. Preferably, the microlenses have the same irregular arrangement on the microlens array as the individual emitter elements on the semiconductor array. This results in an optimal assignment of micro lenses and individual emitter elements. Alternatively, it is also conceivable that the arrangements of microlenses and individual emitter elements differ from one another. Then, the microlens array also forms or at least modifies the pattern.

The 3D-camera is preferably made as a stereo camera and comprises an evaluation unit configured for the application of a stereo algorithm which, for generating a three-dimensional distance image, detects partial regions corresponding to one another in the two images of the monitoring area illuminated by the illumination pattern and captured by the two cameras of the stereo camera, and calculates the distances from their disparity. The increased contrast in the scenery according to the invention assists in detecting dense depth maps even for unfavourable sceneries.

The 3D-camera is preferably made as a safety camera, wherein the evaluation unit is configured to detect forbidden intrusions into the monitoring area and to thereupon generate a shutdown signal, and wherein a safety output is provided to output a shutdown signal to a monitored machine. A reliable generation of a dense depth map is needed for applications in safety technology. This enables the required safe object detection.

The method according to the invention can be extended in a similar way and shows similar advantages. Such advantageous features are described exemplary, but not limiting in the sub claims following the independent claims.

Preferably, two respective images of the illuminated monitoring area are taken from different perspectives, and a three-dimensional distance image is calculated from that by means of a stereo algorithm, wherein partial regions of the two images corresponding to one another are detected, and the distance is calculated based on the disparity.

Preferably, forbidden intrusions into the monitoring area are detected in the distance image, and thereupon a shutdown signal is output to a monitored dangerous machine.

Figure 2:
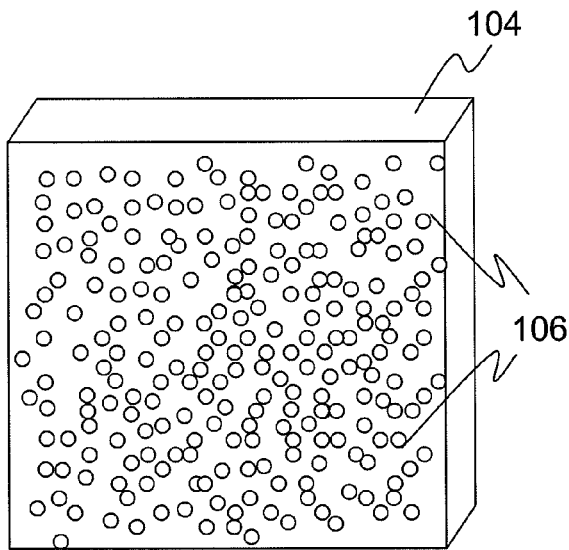
Figure 3:
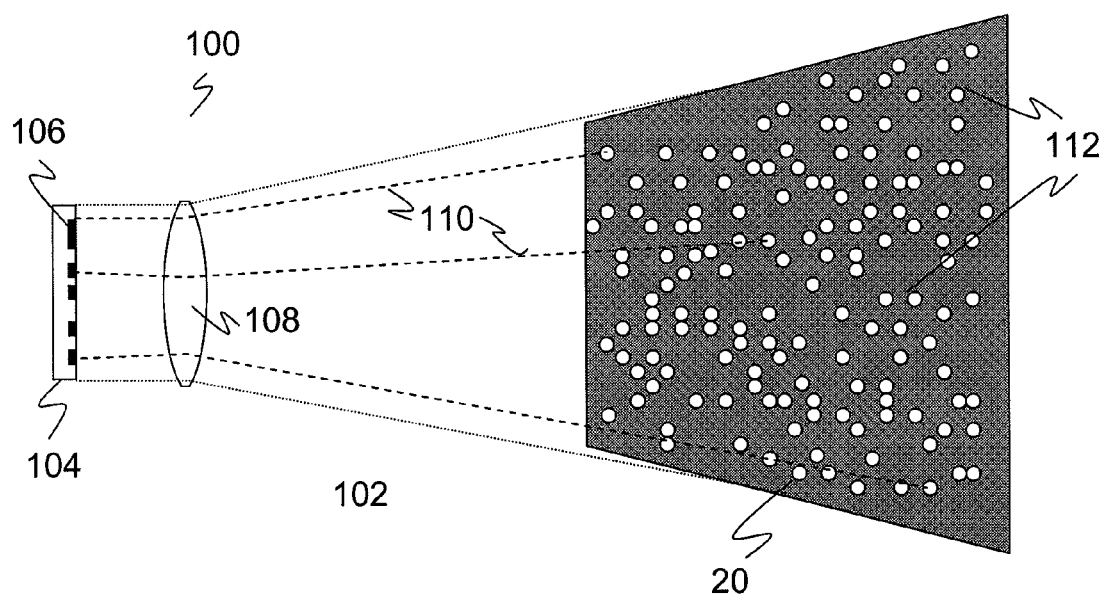
Figure 4:
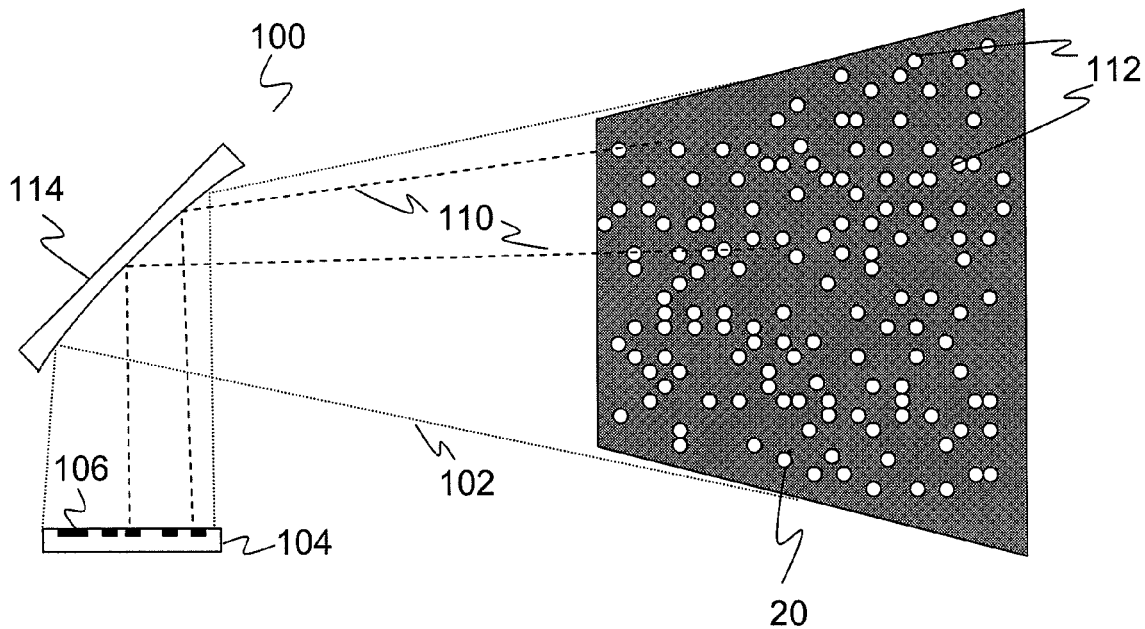
Figure 5:
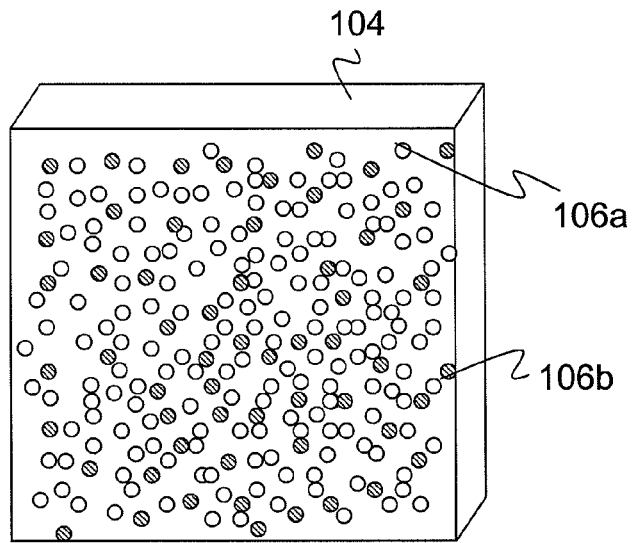

The invention is explained below also with respect to additional features and advantages based on exemplary embodiments and with reference to the drawing. The Figures of the drawing show in:

FIG. 1 a schematic overview of an embodiment of a 3D-camera with a monitoring area illuminated by its illumination unit;

FIG. 2 a schematic top view on a semiconductor array having an irregular arrangement of individual emitter elements;

FIG. 3 a schematic side view of an illumination unit with a semiconductor array according to FIG. 2;

FIG. 4 a schematic side view of an alternative illumination unit similar to FIG. 3 with reflective optics; and FIG. 5 a schematic top view on another semiconductor array with several groups of individual emitter elements which can be selectively activated.

FIG. 1 shows in a schematic three-dimensional representation the general structure of an embodiment of a 3D-camera 10 according to the stereoscopic principle which is used for monitoring a spatial area or monitoring area 12. The invention is described based on this example, but also encompasses other 3D cameras based on triangulation, for example having only one image sensor and evaluating the distance dependent changes of an illumination pattern, as exemplified in the introduction. By monitoring, in particular applications in safety technology are referred to. This may be protection of a dangerous machine by defining three-dimensional protection areas in the monitoring area 12 that are monitored for forbidden intrusions by the 3D-camera 10. Other applications of the 3D-camera 10 are also possible, for example detecting certain movements that are interpreted as a command for the 3D-camera 10 or a connected system.

In the 3D-camera 10, two camera modules are mounted at a known, fixed distance to one another, and each captures images of the monitoring area 12. In each camera, an image sensor 14a, 14b is provided, such as a matrix-shaped imaging chip taking a rectangular pixel image, for example a CCD or a CMOS sensor. An objective with imaging optics is arranged in front of the image sensors 14a, 14b that is shown as a lens 16a, 16b, but can be implemented as arbitrary known imaging optics. The angle of view of these optics is shown in FIG. 1 by dashed lines each forming a pyramid of view 18a, 18b.

In the middle between the two image sensors 14a, 14b, an illumination unit 100 is shown, wherein this spatial arrangement is only to be understood as an example, and the illumination unit may also be asymmetrically arranged or even be arranged outside the 3D-camera 10. The illumination unit 100 generates a structured illumination pattern 20 in an illumination area 102 and is explained in more detail in different embodiments below with reference to FIGS. 2 to 5.

A control 22 which may also be configured as an evaluation unit of the 3D-camera 10 is connected to the two image sensors 14a, 14b and the illumination unit 100. The structured illumination pattern 20 is generated and, if desired, modified in its structure and/or intensity by means of the control 22. The control 22 also receives image data from the image sensors 14a, 14b. From these image data, the control 22 calculates three-dimensional image data (distance image, depth map) of the monitoring area 12 by means of a stereoscopic disparity estimation. The structured illumination pattern 20 provides a good contrast and a structure for each image element in the monitoring area 12 that can be unambiguously identified and correlated.

Upon detection by the control 22 of a forbidden intrusion into a protected area, a warning is output or the source of danger is secured, for example a robot arm or another machine is stopped, via a warning and shutdown device 24 that may be integrated into the control 22. Signals relevant for safety, especially the shutdown signal, are output via a safety output 26 (OSSD, Output Signal Switching Device). In non-safety applications, this functionality is not necessarily required. It is also conceivable that the three-dimensional image data is output as such, and that further evaluations are carried out externally.

In order to be suitable for safety applications, the 3D-camera 10 is failsafe. Among other things, this means that the 3D-camera 10 can test itself in cycles shorter than the required response time, in particular can detect defects of the illumination unit 100 so that it is guaranteed that the illumination pattern 20 is available with an expected minimal intensity, and that the safety output 26 and the warning and shutdown device 24 are safe, for example are configured with two channels. Likewise, the control 22 is failsafe, i.e. evaluates in two channels or uses algorithms capable of testing themselves. Such rules are standardized for general contactless protective devices, for example in EN61486-1 or EN13849-1, respectively. A corresponding standard for safety cameras is currently prepared.

The 3D-camera 10 is surrounded and protected by a housing 28. Through a front screen 30, light can transmit into and from the monitoring area 12. The front screen 30 has filtering properties which are tuned to the transmission frequency of the illumination unit 100. This is because even with high-intensity illumination units 100, under unfavorable circumstances such as a very bright environment, large monitoring volumes, or large distances of 5 m and more, the useful signal cannot be sufficiently detected in the noise of the entire spectrum. With an illumination unit 100 that transmits light only in one or several narrow visible, ultraviolet, or infrared bands, and with a matching filter 30, the signal-to-noise-ratio can be significantly increased, because ambient light outside these bands is no longer relevant. The optical filter 30 can also be differently realized, for example in the optics 16a, 16b of the camera modules.

FIG. 2 shows a schematic top view on a light source for the illumination unit 100. The light source is a semiconductor array 104, in particular a VCSEL array with a plurality of single emitter elements 106. The array has an edge length of a few millimeters, but can also be formed larger. This can not only be achieved by a larger chip, but also by several chips arranged side by side.

Each individual emitter element 106 is formed by a point-like emitter surface of about 10 μm in diameter. This diameter is purely exemplary and scalable by generating the desired size of the resulting pattern elements by a corresponding projection of the size of the individual emitter elements 106 given by the diameter. The semiconductor array 104 comprises a large number of several thousand individual emitter elements 106. Depending on the desired structure of the illumination pattern 20 to be generated, this number can also be larger than ten thousand, a hundred thousand, or even larger.

A characteristic of the semiconductor array 104 is that the individual emitter elements 106 do not form a regular matrix arrangement, but are irregularly distributed. The mutual distances of the individual emitter elements 106 thus vary with a pattern which, for avoiding pseudo correlations, at least locally within the required correlation lengths cannot be mapped onto itself by translations in the relevant directions, for example parallel to the horizon. To maintain this arrangement during the manufacturing process, an irregular rather than a regular mask is used for example in the process step that generates the dot-shaped emitter surfaces. The structure of this mask is predetermined for example by simulation or calculation to optimally support the 3D-camera.

The individual emitter elements 106 can be operated with the same optical output power. Then, the individual pattern elements are equally bright. A preferred embodiment intentionally introduces variations, for example by driving the individual emitter elements 106 with different currents. This can be done by making the individual emitter elements 106 individually controllable. Another possibility which can be operated with a homogenous current and voltage, respectively, and where an individual control can be avoided, is different designs of the individual emitter elements 106, for example different resistances in the leads by different lead thicknesses or the like. Thus, parts of the illumination pattern 20 are intentionally brightened or darkened. One application is a border brightening with especially bright borders of the illumination pattern 20 to compensate for a corresponding drop in intensity at the borders of the image sensors 14a-b or the optics 16a-b, respectively. Thus, particularly homogenously illuminated images are captured. The individual emitter elements 106 in an outer region of the semiconductor array 104 are driven with higher currents than in an inner region, thus emitting more light.

Another possibility to achieve such effects of differing brightness is to vary the surface sizes of the individual emitter elements 106, for example by again using a customized mask in the corresponding process step. Yet another possibility is to intentionally vary the point density or the packing density, respectively, from a homogenous distribution, for example to provide more individual emitter elements 106 in a border region of the semiconductor array 104 than in its interior. Different output powers, surface sizes, and packing densities can also be combined with each other.

FIG. 3 shows in a schematic view of the illumination unit 100 how the illumination pattern 20 is generated by means of the semiconductor array 104. For this purpose, an imaging optics 106 is arranged in front of the semiconductor array 104 which projects the pattern generated by the irregular arrangement of the individual emitter elements 106 on the semiconductor array 104 from the near field at the semiconductor array 104 as the illumination pattern 20 into the illumination area 102 and thus into the monitored scenery. The imaging objective 106 can simply be a converging lens, but can also comprise different or several elements in a known manner.

Accordingly, the illumination pattern 20 is generated by a direct imaging of the individual emitter elements 106 irregularly arranged on the semiconductor array 104. The individual emitter elements 106 positioned at the irregular positions in a plane at the semiconductor array 104 generate a pattern element 112 or a light dot of the illumination pattern 20 via a respective individual light beam 110.

In their entirety, the pattern elements 112 form the irregular illumination pattern 20 that adds the required structure also to a scenery without structure and thus prevents detection of pseudo correlations by a stereo algorithm. As an alternative to a stereo algorithm, changes of an expected structure of the illumination pattern 20 by objects in the scenery can be evaluated.

The generated illumination pattern 20 in its structure directly corresponds to the arrangement of the individual emitter elements 106 with a scaling due to the projection. The representation of the illumination pattern 20 in the Figures is to be understood purely schematic. In practice, the actual number of pattern elements 112 corresponding to the number of individual light emitters 106 will be significantly larger and will also achieve different filling degrees, wherein a filling degree of 10-20% is often sufficient for a reliable generation of a dense depth map.

FIG. 4 shows an alternative construction of the illumination unit 100. Here, instead of a refractive imaging objective 108, reflective imaging optics are used. This can for example be a concave mirror. As for the refractive imaging optics 108, also for the reflective imaging optics 114 other known structures are possible.

FIG. 5 shows an alternative construction of the semiconductor array 104 in a top view. The individual emitter elements 106 are divided into two groups 106a-b illustrated by differently hatched patterns. The groups 106a-b can be individually controlled, so that their respective individual emitter elements 106 are either active or inactive or are illuminated with different brightness. Thus, different illumination patterns 20 can be generated with the same semiconductor array 104 to adapt to different applications, 3D-cameras, or scenarios. If a larger number of such groups is formed, the combinatorics of simultaneously active groups offers a large number of variation options. In the limiting case, the individual emitter elements 106 can even be individually controlled. The general packing density in an embodiment according to FIG. 5 is generally chosen to be somewhat higher than without such groups so that the illumination pattern 20 still has the required filling degree if some groups are not active.

Thus, while for the embodiments explained with reference to FIG. 2 a one-time adaption of the illumination pattern 20 per design may be used, by a group-wise or even individual control of the individual emitter elements 106 the adaption can be done flexibly in a configuration phase or even during operation.

It is also conceivable to arrange the semiconductor array 104 movable with respect to the imaging optics 108, 114. By appropriate adjustment, a partial region of the semiconductor array 104 is selected which is projected as the illumination pattern 20. An adaption can also be done in this manner.

In a further embodiment not shown, a microlens array is arranged in front of the semiconductor array 104. Microlenses in principle are useful to manipulate the structure of the illumination pattern 20 by affecting the position and shape of individual pattern elements 112. Another preferred function of a microlens array when used for the invention is to focus individual pattern elements 112 to compensate for a divergence of the individual emitter elements 106. Thus, the predefined pattern given by the arrangement of the individual emitter elements 106 on the semiconductor array 104 is preserved as the illumination pattern 20. The microlenses on the microlens array are preferably arranged in the same manner as the individual emitter elements 106. Then, a microlens is directly arranged in front of each individual emitter element 106 to specifically effect the desired focusing of the respective pattern element 112.

The invention claimed is:

1. A 3D-camera (10) having at least one image sensor (14a-b) and at least one illumination unit (100) which comprises a light source and which is configured for generating an irregular illumination pattern (20) in an illumination area (12) of the 3D-camera (10), wherein the light source comprises a semiconductor array (104) having a plurality of individual emitter elements (106) in an irregular arrangement, wherein a respective individual emitter element (106) generates a pattern element (112) of the irregular illumination pattern (20), wherein each individual emitter element (106) comprises a point-like emitter surface, and wherein the pattern element (112) generated by the individual emitter element (106) comprises a shape of the emitter surface.

2. The 3D-camera (10) according to claim 1,
wherein the semiconductor array (104) is a VCSEL array.

3. The 3D-camera (10) according to claim 1,
wherein the semiconductor array (104) comprises a large number of at least a thousand, ten thousand, or a hundred thousand individual emitter elements (106).

4. The 3D-camera (10) according to claim 1,
wherein the point-like emitter surfaces have at least one of mutually different shapes and sizes.

5. The 3D-camera (10) according to claim 1,
wherein the individual emitter elements (106) form at least two groups (106a-b), and wherein a group (106a-b) of individual emitter elements (106) can be activated without activating the remaining groups (106a-b) of individual emitter elements (106).

6. The 3D-camera (10) according to claim 1,
wherein the individual emitter elements (106) are controllable with mutually different currents.

7. The 3D-camera (10) according to claim 1,
wherein the density of the individual emitter elements (106) on the semiconductor array (104) varies.

8. The 3D-camera (10) according to claim 1,
wherein the arrangement of the pattern elements (112) in the illumination pattern (20) corresponds to the arrangement of the individual emitter elements (106) on the semiconductor array (104).

9. The 3D-camera (10) according to claim 1,
wherein the illumination unit (100) comprises an imaging objective to image the illumination pattern (20) from the near field at the semiconductor array (104) into the monitoring area (12).

10. The 3D-camera (10) according to claim 9,
wherein imaging objective and semiconductor array (104) are arranged mutually movable to image different subsets of individual emitter elements (106).

11. The 3D-camera (10) according to claim 1,
wherein a microlens array is arranged in front of the semiconductor array (104).

12. The 3D-camera (10) according to claim 11,
wherein the microlenses have the same irregular arrangement on the microlens array as the individual emitter elements (106) on the semiconductor array (104).

13. The 3D-camera (10) according to claim 1,
which is made as a stereo camera and comprises an evaluation unit (22) configured for the application of a stereo algorithm which, for generating a three-dimensional distance image, detects partial regions corresponding to one another in the two images of the monitoring area (12) illuminated by the illumination pattern (20) and captured by the two cameras of the stereo camera, and calculates the distances from their disparity.

14. The 3D-camera (10) according to claim 1,
which is made as a safety camera, wherein the evaluation unit (22) is configured to detect forbidden intrusions into the monitoring area (12) and to thereupon generate a shutdown signal, and wherein a safety output (26) is provided to output a shutdown signal to a monitored machine.

15. A method for the three-dimensional monitoring of a monitoring area (12),
wherein an illumination unit (100) generates an irregular illumination pattern (20) in the monitoring area (12), wherein a 3D-camera (10) captures images of the illuminated monitoring area (12), wherein a plurality of individual light beams (110) is transmitted by a corresponding plurality of individual emitter elements (106) on a semiconductor array (104), wherein the individual emitter elements (106) are arranged irregularly on the semiconductor array (104) and the bundle of individual light beams (110) leads to the irregular illumination pattern (20) due to the irregular arrangement, wherein a respective individual emitter element (106) generates a point-like pattern element (112) of the illumination pattern (20) via its individual light beam (110), wherein each individual emitter element (106) comprises a point-like emitter surface, and wherein the pattern element (112) generated by the individual emitter element (106) comprises a shape of the emitter surface.

* * * * *